United States Patent
Haarburger

(10) Patent No.: US 9,249,922 B2
(45) Date of Patent: Feb. 2, 2016

(54) SYSTEMS AND METHODS FOR DEVICE HOLDERS

(71) Applicant: Nite Ize, Inc., Boulder, CO (US)

(72) Inventor: Daniel J. Haarburger, Boulder, CO (US)

(73) Assignee: Nite Ize, Inc., Boulder, CO (US)

( * ) Notice: Subject to any disclaimer, the term of this patent is extended or adjusted under 35 U.S.C. 154(b) by 0 days.

(21) Appl. No.: 14/587,787

(22) Filed: Dec. 31, 2014

(65) Prior Publication Data

US 2015/0192244 A1   Jul. 9, 2015

Related U.S. Application Data

(60) Provisional application No. 61/924,145, filed on Jan. 6, 2014.

(51) Int. Cl.
| | |
|---|---|
| *A47B 23/04* | (2006.01) |
| *F16M 11/38* | (2006.01) |
| *A47B 97/04* | (2006.01) |
| *F16M 13/00* | (2006.01) |
| *H05K 5/02* | (2006.01) |

(52) U.S. Cl.
CPC ............. *F16M 11/38* (2013.01); *A47B 23/04* (2013.01); *A47B 23/042* (2013.01); *A47B 23/043* (2013.01); *A47B 97/04* (2013.01); *F16M 13/00* (2013.01); *H05K 5/0204* (2013.01)

(58) Field of Classification Search
CPC .... A47B 23/043; A47B 23/042; A47B 23/04; A47B 23/00; A47B 23/001; A47B 23/06; A47B 97/04; A47B 97/00; A47F 1/12; A47G 1/24; F16M 11/10; F16M 13/022; F16M 13/1304; F16M 11/24; F16M 11/38; F16M 13/00
USPC ............. 248/441.1, 444, 447–458, 460, 462, 248/463
See application file for complete search history.

(56) References Cited

U.S. PATENT DOCUMENTS

| | | | | |
|---|---|---|---|---|
| 2,014,176 | A * | 9/1935 | Henderson | 248/456 |
| 2,591,170 | A * | 4/1952 | Levinson et al. | 248/456 |
| 3,447,770 | A * | 6/1969 | Gallamos | 248/453 |
| 3,460,795 | A * | 8/1969 | Dahlin | 248/452 |
| 3,937,435 | A * | 2/1976 | Roberts | 248/464 |
| 4,674,724 | A * | 6/1987 | Gaudet | 248/459 |
| 5,999,340 | A * | 12/1999 | Goff et al. | 359/804 |

(Continued)

FOREIGN PATENT DOCUMENTS

WO   WO-2005020752 A1   3/2005

*Primary Examiner* — Nkeisha Smith
(74) *Attorney, Agent, or Firm* — Haynes and Boone, LLP

(57) ABSTRACT

A foldable stand includes a body having an approximately planar shape. The foldable stand further includes a first inner portion hingably attached to the body. The foldable stand further includes a second inner portion hingably attached to the body. The foldable stand further includes a third inner portion hingably attached to the body, wherein the first inner portion and the second inner portion rotate away from the approximately planar shape of the body to intersect and create an approximately triangular support having the first inner portion as a first side, the second inner portion as a second side, and the body as a third side; and the third inner portion rotates away from the approximately planar shape of the body, providing for an extended stand configuration which is configured to receive an approximately rectangular prism shaped item.

14 Claims, 4 Drawing Sheets

(56) References Cited

U.S. PATENT DOCUMENTS

| | | | |
|---|---|---|---|
| 7,770,864 B2* | 8/2010 | Phifer et al. | 248/455 |
| 7,861,995 B2* | 1/2011 | Liou | 248/454 |
| 8,100,376 B2* | 1/2012 | Ye | 248/454 |
| 8,950,720 B1* | 2/2015 | Carr | 248/460 |
| D729,223 S * | 5/2015 | Haarburger | D14/253 |
| 2004/0046097 A1* | 3/2004 | Stearns | 248/441.1 |
| 2005/0098703 A1* | 5/2005 | Cziraky | 248/460 |
| 2008/0149801 A1* | 6/2008 | Wood | 248/450 |
| 2010/0090085 A1* | 4/2010 | Corrion | 248/459 |
| 2010/0213331 A1 | 8/2010 | Liou | |
| 2012/0037047 A1* | 2/2012 | Moldovan | 108/3 |
| 2013/0270413 A1* | 10/2013 | Wilber et al. | 248/558 |
| 2014/0097316 A1* | 4/2014 | Hsu et al. | 248/351 |
| 2015/0034781 A1* | 2/2015 | Kim et al. | 248/174 |
| 2015/0108316 A1* | 4/2015 | Hou et al. | 248/450 |

\* cited by examiner

SYSTEMS AND METHODS FOR DEVICE HOLDERS

CROSS-REFERENCE TO RELATED APPLICATIONS

This application claims the benefit of U.S. Provisional Patent Application No. 61/924,145 filed Jan. 6, 2014, and is incorporated by reference to the same extent as though fully contained herein.

BACKGROUND

Mobile devices, such as phones, tablets, and other devices are easily held in the hand of the user. In many cases, it is desirable to hold the device perpendicular to the eyes of the user. Reasons for this configuration may include ease of view and minimization of glare among other reasons. When viewing a device for an extended period of time, the hands of the user may become tired; and it is desirable to have a stand for the mobile device to optimize viewing. It is also desirable that this stand be portable, so that the user may utilize it in many circumstances.

DETAILED DESCRIPTION

Figure 1:
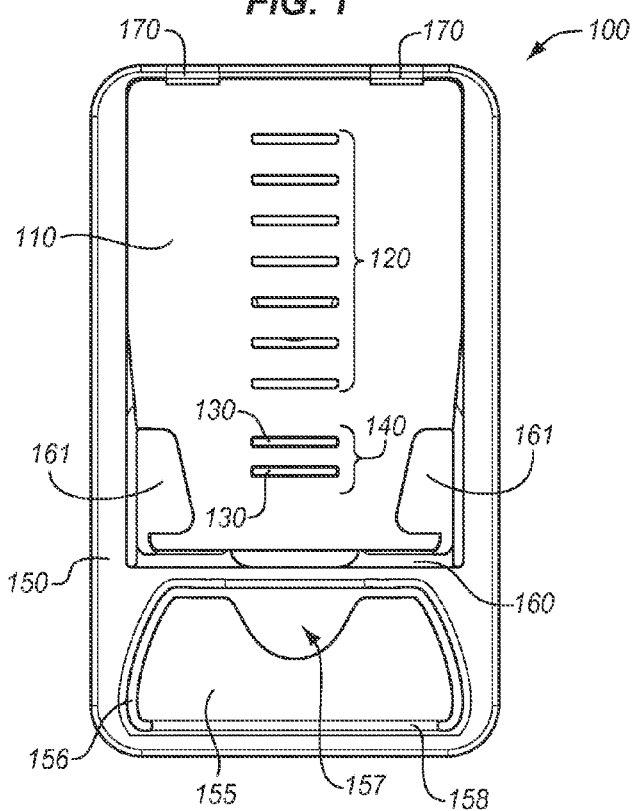
FIG. 1 shows a front view of one embodiment of a foldable stand.

Certain terminology is used herein for convenience only and is not to be taken as a limitation on the embodiments of systems and methods for a device holder. In the drawings, the same reference letters are employed for designating the same elements throughout the several figures.

The words "right," "left," "front," and "back" designate directions in the drawings to which reference is made. The words "inwardly" and "outwardly" refer to directions toward and away from, respectively, the geometric center of the device holder and designated parts thereof. The terminology includes the words above specifically mentioned, derivatives thereof, and words of similar import. The proportions of the drawings are reflective of the electronic devices that they are designed to fit and the drawings generally reflect scaled up or scaled down proportional representations of these device holders.

Like reference numerals designate like or corresponding parts throughout the various views and with particular reference as delineated below.

Embodiments of a foldable stand for an electronic device include an extremely small and portable stand about the size of a credit card when folded in a non-holding configuration. A first inner portion of the stand may fold up and be braced by a second inner portion of the stand. The first inner portion has multiple slots for receiving the second inner portion so that it may be arranged at a variety of angles to the surface on which it sits. The stand also has a third inner portion that may fold up to provide for a stop that may prevent the electronic device from falling out of the foldable stand. Although the foldable stand generally is designed for electronic devices, it may be used with any item that the user desires to hold in an upright configuration. The stand generally works best with rectangular items.

FIG. 1 shows a front view of one embodiment of a foldable stand 100. The foldable stand 100 generally is composed of two materials: polypropylene and aluminum. First inner portion 110 generally provides the primary vertical support mechanism for the foldable stand 100. First inner portion 110 may be made of aluminum in many embodiments, but generally any stiff and strong material may be used for first inner portion 110. First inner portion 110 is generally rectangular. In alternatives, first inner portion 110 may have varying shapes. First inner portion 110 includes a first plurality of slots 120 and a second plurality of slots 130. The first plurality of slots 120 are for receiving the end of a second inner portion of which only tabs 140 are visible in this view. This allows the user to arrange the first inner portion 110 at an angle to the body 150 of the foldable stand 100. The second plurality of slots 130 provides for locking the second inner portion in place when the foldable stand 100 is in a folded configuration. The second plurality of slots 130 is configured to receive tabs 140. These tabs 140 generally are snap fit and serve to hold the first inner portion 110 in a locked position. Body 150 generally includes a recess area that fits first inner portion 110.

The body 150 of the foldable stand 100 generally is formed of a semi-rigid material. In many embodiments, body 150 is formed of polypropylene; however, alternative materials having some flexibility at thinner thicknesses while still being rigid at greater thicknesses may be used. Body 150 includes third inner portion 155. Third inner portion 155 is formed from cutout 156, finger hole 157, and hinge portion 158. Generally, this may be formed via an extrusion process; however, alternatively the third inner portion 155 may be formed by making cuts in the body 150. Using finger hole 157, the user may flex the third inner portion 155 up about hinge portion 158. Third inner portion 155 then may serve as a stop for an electronic device resting against first inner portion 110. Hinge portion 158 is formed by making the polypropylene or other material forming body 150 thinner. This may be referred to as a living hinge.

The body 150 also includes a second living hinge 160. The first inner portion 110 may have an aluminum body and may be separate from body 150 until it is attached using holders 161 (and the related tabs and holders visible in FIG. 2). The first inner portion 110 then may be rotated about living hinge 160 to raise first inner portion 110 to stand at an angle to body portion 150. Further visible in this figure are snap fit tabs 170, which serve to further hold first inner portion 110 in place. To fold first inner portion 110 into a folded position, the user pushes the first inner portion 110 past snap fit tabs 170.

Figure 2:
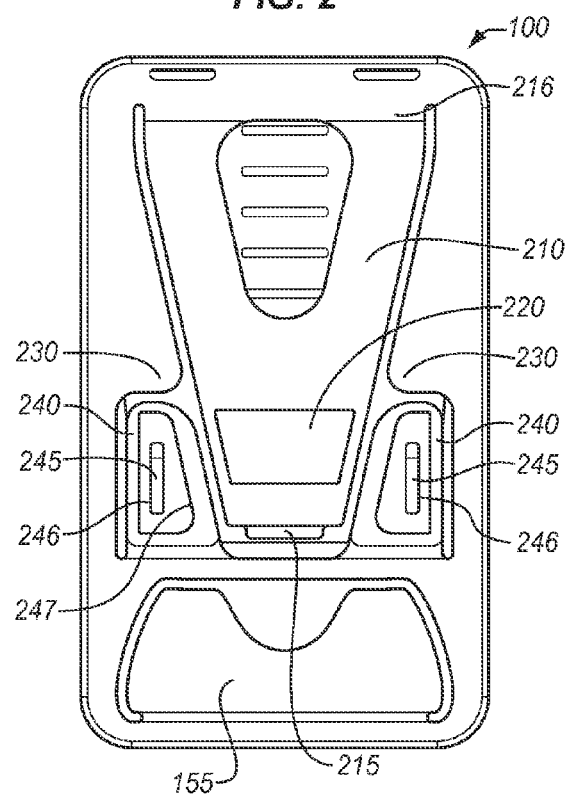
FIG. 2 shows a rear view of the foldable stand of FIG. 1.

FIG. 2 shows a rear view of the foldable stand 100. Here, second inner portion 210 is visible. Second inner portion 210 serves to brace first inner portion 110 in an extended position when extended to a stand configuration. Second inner portion 210 includes tab 215, which may be positioned in the plurality of slots 120 in the first inner portion 110. The non-visible side of second inner portion 210 also includes tabs 140, which interface with slots 130. To add additional stiffness to second inner portion 210, an insert 220 may be included in many embodiments. Second inner portion 210 may include a cavity for receiving insert 220 (composed of aluminum in many embodiments). Second inner portion 210 may rotate about living hinge 216 such that it may brace first inner body portion 110. First inner body portion 110 may also be referred to as a vertical stand piece and second inner body portion 120 may be referred to as a stand brace. Body 150 also includes braces 230, which prevent the first inner body portion 110 from rotating through body 150 towards second inner portion 210. These braces 230 help retain the device in a folded position. Holders 240 cooperate with holders 161 to form a slot that holds and receives first inner portion 110. Holders 161 include snap tabs 245 which snap fit into slots 246 in first inner portion 110. The cutout nature 247 of holders 240 allows for the snap tabs 245 to fit through first inner portion 110 while maintaining a narrow slot to receive first inner portion 110. Without these cutouts, the slot formed by holders 161 and holders 240 would not be as snug about first inner portion 110.

Figure 3A:
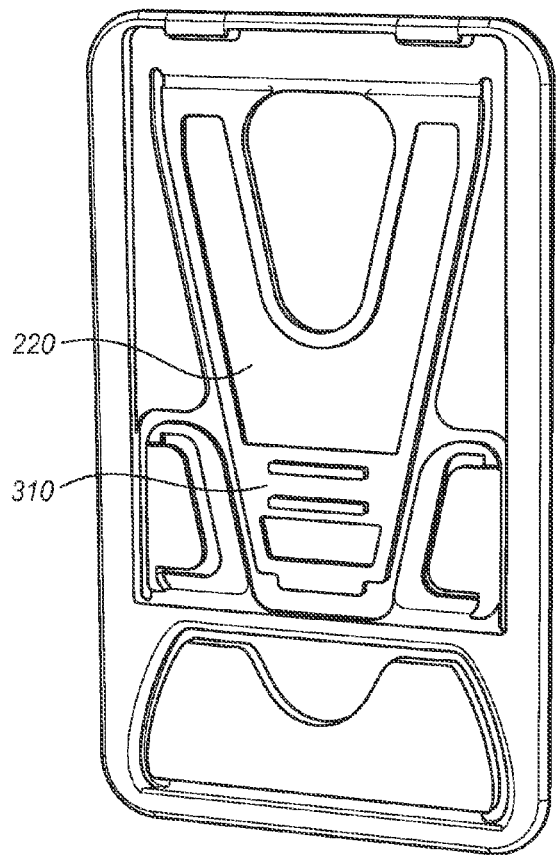
FIG. 3a shows a front view of the foldable stand of FIG. 1 with first inner portion removed.
Figure 3B:
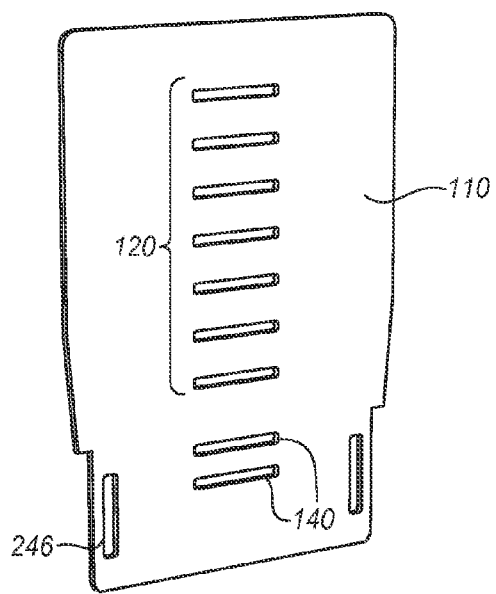
FIGS. 3b and 3c show a perspective view of the stiffeners for use with the foldable stand of FIG. 1.
Figure 3C:
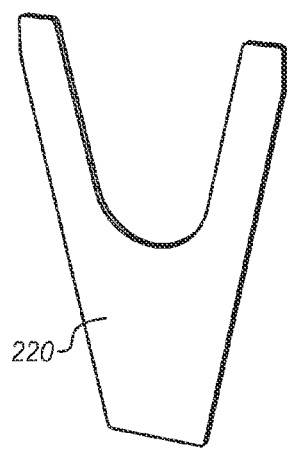

FIG. 3 shows a front view of the foldable stand 100 with first inner portion 110 removed. Here, insert 220 is visible in greater detail. Second inner portion 210 includes a cavity shaped like insert 220 and a retaining band 310 to hold insert 220 in place. The cavity in insert 220 provides for a snap fit arrangement, and the retaining band 310 provides for retention of the snap fit holding of insert 220.

Figure 4:
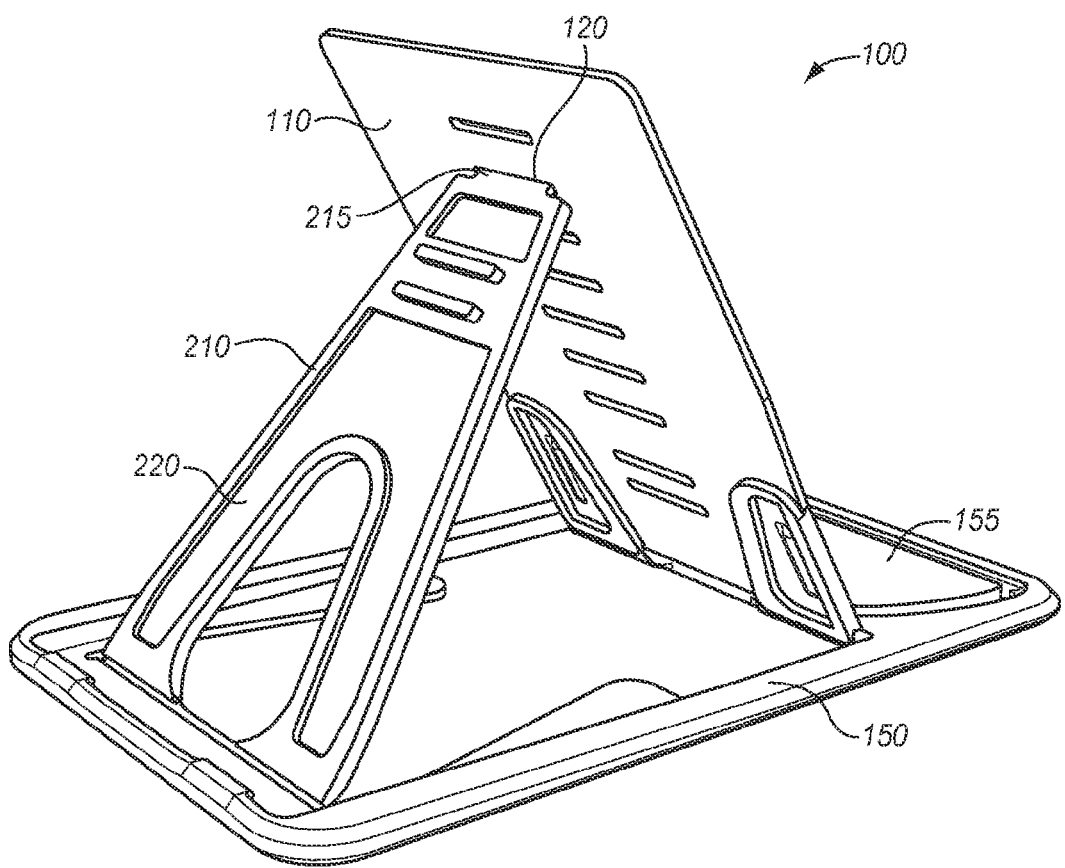
FIG. 4 shows a perspective view of the foldable stand of FIG. 1 in an extended stand configuration.
Figure 5:
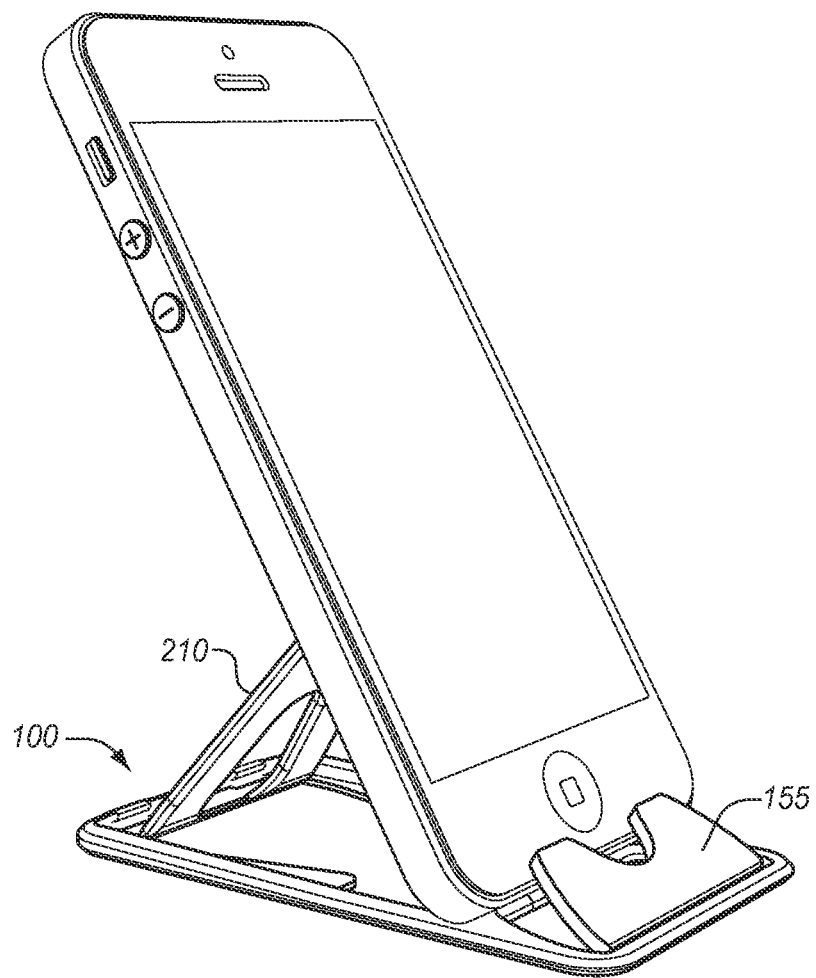
FIG. 5 shows a perspective view of the foldable stand of FIG. 1 with an electronic device.

FIG. 4 shows a perspective view of foldable stand 100 in an extended stand configuration. Here, it can be seen that tab 215 of second inner portion 210 interfaces with the plurality of slots 120 of first inner portion 110 forming a triangular shape with body 150 as the base. In this way, a rest for an electronic device or other item is formed. In FIG. 5, another perspective view is show with an electronic device resting on foldable stand 100. The operation of third inner portion 155 to brace the electronic device against first inner portion 110 can be seen in this figure.

Due to the materials and configuration used, the foldable stand 100 is very small and is approximately of credit card size. Therefore, it may be easily carried with the user, either in the user's pocket, purse, or wallet and readily deployed.

In one embodiment, a foldable stand includes a body having an approximately planar shape. The foldable stand further includes a first inner portion, hingably attached to the body. The foldable stand further includes a second inner portion hingably attached to the body. The foldable stand further includes a third inner portion hingably attached to the body, wherein the first inner portion and the second inner portion rotate away from the approximately planar shape of the body to intersect and create an approximately triangular support having the first inner portion as a first side, the second inner portion as a second side, and the body as a third side; and the third inner portion rotates away from the approximately planar shape of the body, providing for an extended stand configuration which is configured to receive an approximately rectangular prism-shaped item. Optionally, the foldable stand additionally includes a folded configuration, wherein in the folded configuration the first and second inner portions are approximately collocated within a first cavity of the body, such that the first and second inner portions fold into the approximately planar shape of the body. Alternatively, in the folded configuration, the third inner portion folds into a second cavity of the body, such that the first and second inner portions fold into the approximately planar shape of the body. In one configuration, the first inner portion includes a first plurality of slots for receiving a first tab of the second inner portion, the first plurality of slots and the first tab cooperating to hold the first inner portion and the second inner portion in the extended stand configuration. In another configuration, the first inner portion includes a second plurality of slots for receiving second tabs of the second inner portion, the second plurality of slots and the second tabs cooperating to hold the first and second inner portions together in the folded configuration. In one alternative, the body includes a first holder and a second holder that form a slot for receiving the first inner portion. In another alternative, the first and second holders are attached to the body via a living hinge, and the first holder includes a third tab for interfacing with a third slot in the first inner portion. Optionally, the second holder includes a cutout for allowing the third tab and third slot to interface without interference from the second holder. Alternatively, the third inner portion is attached to the body via a living hinge. In another alternative, the second inner portion includes an insert for increasing the stiffness of the second inner portion. Optionally, the first and second portions rotate in a first direction to form the extended stand configuration; and in the folded configuration, the first inner portion is further in the first direction from the body than the second inner portion, and the body includes braces for preventing the first inner portion from rotating in a direction opposite the first direction through the body, the braces assisting in retaining the foldable stand in the folded configuration. Alternatively, the body further includes a top tab for holding the first inner portion in a snap fit arrangement in the folded configuration. Optionally, a cavity in the second inner portion receives the insert in a snap fit arrangement, and the second inner portion includes a retaining band for further holding the insert in place. Alternatively, the body, the second inner portion, and the third inner portion are a single piece of material. In one configuration, the body, the second inner portion, and the third inner portion are a single uniform piece of material. In another configuration, the body, the second inner portion, and the third inner portion are polypropylene. Optionally, the first inner portion is aluminum. Alternatively, the second inner portion includes an insert and the insert is aluminum. Optionally, the foldable stand is approximately credit card size. In one configuration, the first, second, and third inner portions each are attached to the body via a living hinge.

In another embodiment, a foldable stand includes a body having an approximately rectangular prism shape, the rectangular prism shape having a small height such that the body resembles an approximately planar shape of a very narrow height compared to a length and width of the body. The foldable stand further includes a first inner portion hingably attached to the body. The foldable stand further includes a second inner portion hingably attached to the body. The foldable stand further includes a third inner portion hingably attached to the body, wherein the first inner portion and the second inner portion rotate away from the approximately planar shape of the body to intersect and create an approximately triangular support having the first inner portion as a first side, the second inner portion as a second side, and the body as a third side; and the third inner portion rotates away from the approximately planar shape of the body, providing for an extended stand configuration which is configured to receive an approximately rectangular prism shaped item.

While specific embodiments have been described in detail in the foregoing detailed description and illustrated in the accompanying drawings, it will be appreciated by those skilled in the art that various modifications and alternatives to those details could be developed in light of the overall teachings of the disclosure and the broad inventive concepts thereof. It is understood, therefore, that the scope of this disclosure is not limited to the particular examples and implementations disclosed herein, but is intended to cover modifications within the spirit and scope thereof as defined by the appended claims and any and all equivalents thereof. Note that, although particular embodiments are shown, features of each attachment may be interchanged between embodiments. The previous detailed description is of a small number of embodiments for implementing the systems and methods for a foldable stand and is not intended to be limiting in scope. The following claims set forth a number of the embodiments of the systems and methods for a foldable stand disclosed with greater particularity.

The invention claimed is:

1. A foldable stand, comprising:
a body having an approximately planar shape;
a first inner portion hingably attached to the body;
a second inner portion hingably attached to the body;
a third inner portion hingably attached to the body, wherein the first inner portion and the second inner portion rotate away from the approximately planar shape of the body to intersect and create an approximately triangular support having the first inner portion as a first side, the second inner portion as a second side, and the body as a third side;
and the third inner portion rotates away from the approximately planar shape of the body, providing for an extended stand configuration which is configured to receive an approximately rectangular prism shaped item, wherein the foldable stand additionally includes a folded configuration, wherein in the folded configuration the first and second inner portions are approximately collocated within a first cavity of the body, such that the first and second inner portions fold into the approximately planar shape of the body, and in the folded configuration, the third inner portion folds into a second cavity of the body, such that the first and second inner portions fold into the approximately planar shape of the body, and the first inner portion includes a first plurality of slots for receiving a first tab of the second inner portion, the first plurality of slots and the first tab cooperating to hold the first and second inner portions in the extended stand configuration, and the first inner portion includes a second plurality of slots for receiving second tabs of the second inner portion, the second plurality of slots and the second tabs cooperating to hold the first and second inner portions together in the folded configuration, and the body includes a first holder and a second holder that form a slot for receiving the first inner portion, and the first and second holders are attached to the body via a living hinge, and the first holder includes a third tab for interfacing with a third slot in the first inner portion.

2. The foldable stand of claim 1, wherein the second holder includes a cutout for allowing the third tab and third slot to interface without interference from the second holder.

3. The foldable stand of claim 2, wherein the third inner portion is attached to the body via a living hinge.

4. The foldable stand of claim 1, wherein the second inner portion includes an insert for increasing the stiffness of the second inner portion.

5. The foldable stand of claim 4, wherein a cavity in the second inner portion receives the insert in a snap fit arrangement, and the second inner portion includes a retaining band for further holding the insert in place.

6. The foldable stand of claim 1, wherein the body, the second inner portion, and the third inner portion are a single piece of material.

7. The foldable stand of claim 1, wherein the body, the second inner portion, and the third inner portion are a single uniform piece of material.

8. The foldable stand of claim 6, wherein the body, the second inner portion, and the third inner portion are polypropylene.

9. The foldable stand of claim 1, wherein the first inner portion is aluminum.

10. The foldable stand of claim 1, wherein the second inner portion includes an insert, and the insert is aluminum.

11. The foldable stand of claim 1, wherein the foldable stand is approximately credit card size.

12. The foldable stand of claim 1, wherein the first, second, and third inner portions each are attached to the body via a living hinge.

13. A foldable stand, comprising:
a body having an approximately planar shape;
a first inner portion hingably attached to the body;
a second inner portion hingably attached to the body;
a third inner portion hingably attached to the body, wherein the first and second inner portions rotate away from the approximately planar shape of the body to intersect and create an approximately triangular support having the first inner portion as a first side, the second inner portion as a second side, and the body as a third side;
and the third inner portion rotates away from the approximately planar shape of the body, providing for an extended stand configuration which is configured to receive an approximately rectangular prism-shaped item, wherein the foldable stand additionally includes a folded configuration, wherein in the folded configuration the first and second inner portions are approximately collocated within a first cavity of the body, such that the first and second inner portions fold into the approximately planar shape of the body; and in the folded configuration, the third inner portion folds into a second cavity of the body, such that the first and second inner portions fold into the approximately planar shape of the body, and the first inner portion includes a first plurality of slots for receiving a first tab of the second inner portion, the first plurality of slots and the first tab cooperating to hold the first and second inner portions in the extended stand configuration and the first inner portion includes a second plurality of slots for receiving second tabs of the second inner portion, the second plurality of slots and the second tabs cooperating to hold the first and second inner portions together in the folded configuration, wherein the first and second inner portions rotate in a first direction to form the extended stand configuration; and in the folded configuration, the first inner portion is further in the first direction from the body than the second inner portion; and the body includes braces for preventing the first inner portion from rotating in a direction opposite the first direction through the body, the braces assisting in retaining the foldable stand in the folded configuration.

14. The foldable stand of claim 13, wherein the body further includes a top tab for holding the first inner portion in a snap fit arrangement in the folded configuration.

* * * * *